United States Patent [19]
Das et al.

[11] Patent Number: 5,977,787
[45] Date of Patent: Nov. 2, 1999

[54] LARGE AREA MULTIPLE-CHIP PROBE ASSEMBLY AND METHOD OF MAKING THE SAME

[75] Inventors: Gobina Das, Hopewell Junction; Paul Mathew Gaschke, Wappingers Falls; Suryanarayan G. Hegde, Hollowville, all of N.Y.; Mark Raymond LaForce, Essex Junction, Vt.; Dale Curtis McHerron, Staatsburg, N.Y.; Charles Hampton Perry, Poughkeepsie, N.Y.; Frederick L. Taber, Jr., LaGrangeville, N.Y.

[73] Assignee: International Business Machines Corporation, Armonk, N.Y.

[21] Appl. No.: 08/876,664

[22] Filed: Jun. 16, 1997

[51] Int. Cl.$^6$ .................................................. G01R 1/073
[52] U.S. Cl. .......................... 324/761; 324/758; 324/760
[58] Field of Search .................................... 324/754, 758, 324/760, 761

[56] References Cited

U.S. PATENT DOCUMENTS

| | | | |
|---|---|---|---|
| 3,806,801 | 4/1974 | Bove | 324/72.5 |
| 4,063,172 | 12/1977 | Faure | 324/756 |
| 4,506,215 | 3/1985 | Coughlin | 324/761 |
| 4,686,464 | 8/1987 | Elsässer et al. | 324/761 |
| 4,783,624 | 11/1988 | Sabin | 324/758 |
| 4,901,013 | 2/1990 | Benedetto et al. | 324/761 |
| 4,963,822 | 10/1990 | Prokopp | 324/758 |
| 5,210,485 | 5/1993 | Kreiger et al. | 324/758 |
| 5,367,254 | 11/1994 | Faure | 324/761 |
| 5,385,477 | 1/1995 | Vaynkof et al. | 439/66 |
| 5,488,314 | 1/1996 | Brandt et al. | 324/758 |
| 5,517,126 | 5/1996 | Yamaguchi | 324/578 |
| 5,521,522 | 5/1996 | Abe et al. | 324/758 |
| 5,600,257 | 2/1997 | Leas et al. | 324/754 |

OTHER PUBLICATIONS

Lorber et al., "Non–Adhering Probe for Contacting Solder Pads," *IBM Technical Disclosure Bulletin*, vol. 26, NO. 1, Jun. 1983, p. 251.

"Method of Chip Burn–In," *IBM Technical Disclosure Bulletin*, vol. 38, No. 11, Nov. 1995, pp. 191–192.

*Primary Examiner*—Glenn W. Brown
*Attorney, Agent, or Firm*—James M. Leas

[57] ABSTRACT

A multiple-chip probe assembly suitable for wafer testing over a wide temperature range includes a plurality of individual buckling beam probe elements. A support structure supports the plurality of buckling beam probe elements in an arrangement in accordance with an electrical contact footprint for use in electrically contacting multiple chips of a wafer under test and enables buckling movement in a contacting direction of the plurality of buckling beams. The support structure includes a principal support material having a thermal coefficient of expansion (TCE) matched with the wafer under test and a second material other than the principal support material, wherein a contact positioning of the plurality of buckling beam probe elements upon the wafer under test during a testing operation is maintained. The second material prevents an individual probe element from electrically contacting the principal support material.

31 Claims, 10 Drawing Sheets

LARGE AREA MULTIPLE-CHIP PROBE ASSEMBLY AND METHOD OF MAKING THE SAME

BACKGROUND OF THE INVENTION

1. Field of the Invention

This invention relates generally to electronic devices for testing and burning-in integrated circuits and, more particularly, to a multiple-chip probe assembly for use in a wafer test and burn-in system.

2. Discussion of the Related Art

Electronic integrated circuitry is burned-in under extreme conditions of temperature and voltage after manufacture in order to exaggerate the failure rate of defective circuitry while ensuring greater reliability of the circuitry which survives the stressful conditions. Because the rate of electronic component failure is significantly higher during the early life of a component, testing under stressful conditions is an effective method of identifying integrated circuit chips which would likely experience early failure in the field.

Systems for burning-in individual integrated circuit chips are available but expensive and difficult to make. Burn-in would be best accomplished while the individual circuits reside on their respective wafers before dicing into individual chips. Such a method of wafer-level burn-in has long been sought in the industry. As described in commonly assigned U.S. Pat. No. 5,600,257, entitled SEMICONDUCTOR WAFER TEST AND BURN-IN, problems with wafer level burn-in include alignment of test probes and thermal matching. As for probe alignment, each of the integrated circuits on the wafer has contact points on the surface of the wafer which must be contacted by a particular probe element of a multi-probe element test head assembly. The diminutive size of the test contact points requires that the probe elements of the test head assembly be of an appropriately small size, and further that the test head probe elements be precisely aligned with the test contact points on the integrated circuits undergoing the test.

The precise alignment between the probe elements of the test head assembly and the test contact points on the integrated circuits is difficult to maintain over the temperature range utilized during burn-in, for example, at temperatures between about 100° C. to 160° C. Probe elements, for example, may include cobra probes, such as described in commonly assigned U.S. Pat. No. 4,027,925 to Byrnes et al., entitled CONTACT FOR AN ELECTRICAL CONTACTOR ASSEMBLY. Heating of the wafer, which is typically comprised of silicon, results in expansion (in all three axes X,Y,Z) which cause problems due to the diminutive size of the test contact points on the integrated circuits of the wafer. The probe elements can also be affected. As a result, the probe elements of the test head assembly may become misaligned with respect to these test contact points to such an extent that the probe elements no longer contact the test contact points. Maintaining contact is of critical importance in most aspects of testing and burn-in.

As described in the '257 patent, the problem has been solved by providing the test head assembly with a material possessing the same or similar thermal expansion coefficient as that of silicon. At the same time, the test head assembly must provide means to effectively and accurately position the probe elements so that proper initial contact may be made and maintained with the test contact points on the integrated circuits being tested.

In addition to the above, contacting probe systems for wafer test currently permit contact of 1 to 16 chip sites of a wafer under test at a single time. As a result, multiple probings are required to test all of the chip sites of the wafer.

It is thus desirable to provide an improved probe assembly for testing the chip sites of an entire wafer at a single time during testing, and to provide a method of constructing the probe assembly.

SUMMARY OF THE INVENTION

It is an object of the present invention to minimize adverse effects of thermal coefficient of expansion mismatches between a probe assembly and a wafer in the burn-in of the integrated circuits of the wafer, and more particularly, to overcome the problem of misalignment between wafer test pads of the wafer and test probe elements of the probe assembly over a wide temperature range of a testing operation.

It is another object of the present invention to simultaneously further provide a test probe assembly for testing all of the chip sites of a wafer under test at a single time, while further providing the advantageous use of cobra probes at burn-in temperatures.

In accordance with the present invention, a multiple-chip probe assembly suitable for wafer testing over a wide temperature range includes a plurality of individual buckling beam probe elements. A support means is provided for supporting the plurality of buckling beam probe elements in an arrangement in accordance with an electrical contact footprint. The electrical contact footprint corresponds to a pattern for electrically contacting multiple chips of a wafer under test. The support means is also for enabling buckling movement in a contacting direction of the plurality of buckling beams. The support means includes a principal support material having a thermal coefficient of expansion matched with the wafer under test and a second material other than the principal support material. The principal support material of the multiple-chip probe assembly ensures that a contact positioning of the plurality of buckling beam probe elements upon the wafer during a testing operation is maintained. The second material prevents an individual probe element from contacting the principal support material.

The present invention further includes a test apparatus for testing a wafer over a wide temperature range having a multiple-chip probe assembly as disclosed herein. In addition, the present invention includes a method of making a multiple-chip probe assembly.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, where like reference numerals are used to identify like parts in the various views and in which.

DETAILED DESCRIPTION OF A PREFERRED EMBODIMENT OF THE INVENTION

Figure 1:
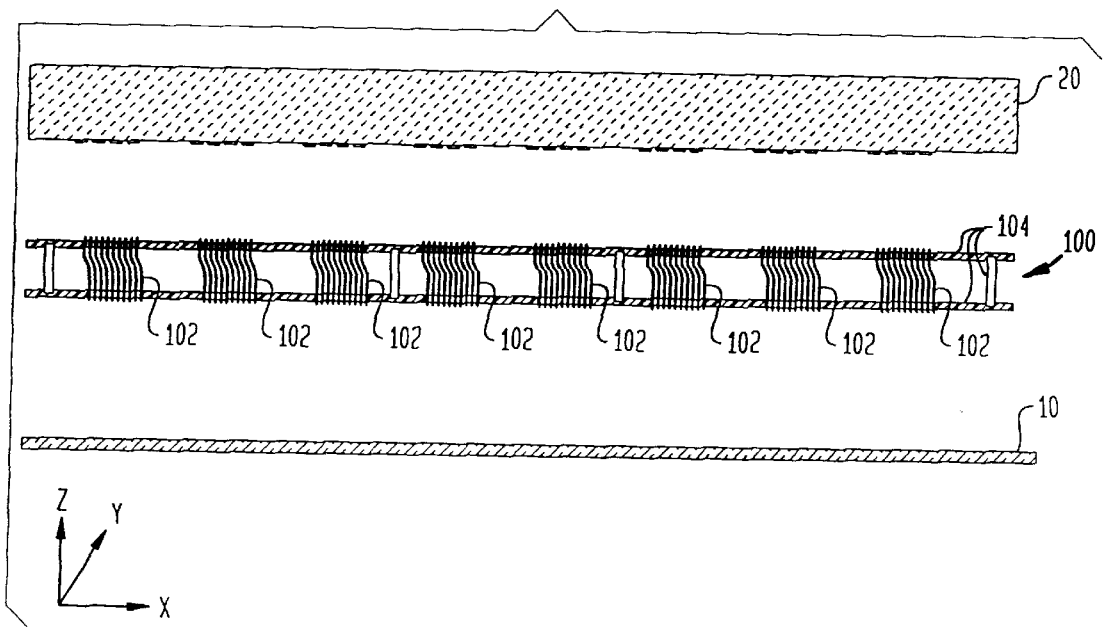
FIG. 1 illustrates a side-view of a large area multiple-chip probe assembly for testing chip sites of an entire wafer according to the present invention.

Turning now to the FIG. 1, a multiple-chip probe assembly 100 in accordance with the present invention shall be described. The multiple-chip probe assembly 100 is suitable for wafer testing over a wide temperature range, for example, from room temperature to a burn-in temperature on the order of 160° C. or higher. During a testing of the chip sites on a wafer 10, the multiple-chip probe assembly 100 according to the present invention is used for connecting the contact pads of the chip sites on the wafer 10 with corresponding contact pads of a glass ceramic substrate 20 of a testing apparatus. During temperature stressing, material expansion occurs in all three axes. Excessive X, Y axis movement, which would normally cause misalignment to occur in prior known cobra probe implementations, is advantageously overcome with the use of the multiple-chip cobra probe assembly 100 according to the present invention. In other words, the multiple-chip probe assembly 100 advantageously minimizes any adverse effects of thermal coefficient of expansion mismatches as shall be further understood from the description herein below.

Referring still to FIG. 1, the probe assembly 100 includes a plurality of individual buckling beam probe elements 102 and a support means 104. Buckling beam probe elements 102 may include known probe elements or cobra probes, such as described in commonly assigned U.S. Pat. No. 4,027,935, to Byrnes et al., entitled "Contact For An Electrical Contactor Assembly" or as described in the article "Probing Considerations in C-4 Testing of IC Wafers" by D. J. Genin et al., International Journal of Microcircuit and Electronic Packaging, Vol. 15, No. 4, 1992, page 229. The support means 104 supports the plurality of buckling beam probe elements in an arrangement in accordance with an electrical contact footprint (not shown) for use in electrically contacting multiple chips of a wafer 10 under test. The support means 104 further enables buckling movement in a contacting direction (along the z-axis as shown) of the plurality of buckling beams 102. The support means 104 includes a principal support material having a thermal expansion coefficient (TCE) that is close to the TCE of silicon, and may also include a second material to insulate the buckling beam elements from the principal support material. The principal support material can be an iron-nickel alloy such as INVAR, that has a thermal coefficient of expansion (TCE) of about $5.4 \times 10^{-6}$ m/m/° C. ($3 \times 10^{-6}$ in/in/° F.) which is close to the TCE of silicon. INVAR contains about 36% nickel with the balance iron. Other materials can also be used, including ternary alloys of iron, nickel, and cobalt (KOVAR), and low TCE metals, such as Tungsten, molybdenum and zirconium. The principal support material ensures that positioning of the plurality of buckling beam probe elements 102 upon the contact pads of wafer 10 during a testing operation is maintained. The second material includes an insulative, non-conductive material and prevents an individual probe element from electrically shorting to the principal support material as shall be discussed in further detail herein below.

Figure 2:
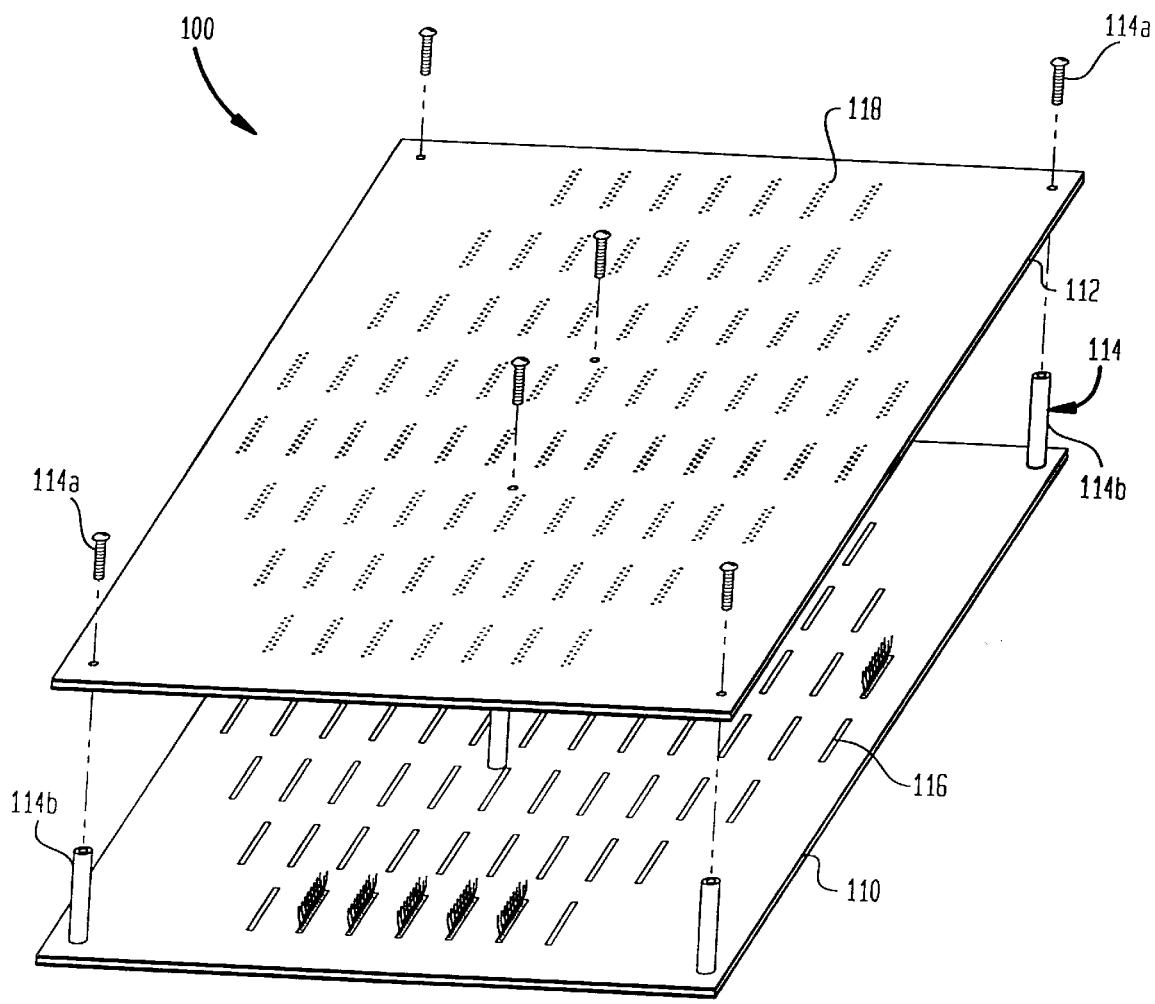
FIGS. 2–5 illustrate various stages of making a large area multiple-chip probe assembly according to one embodiment of the present invention.
Figure 4:
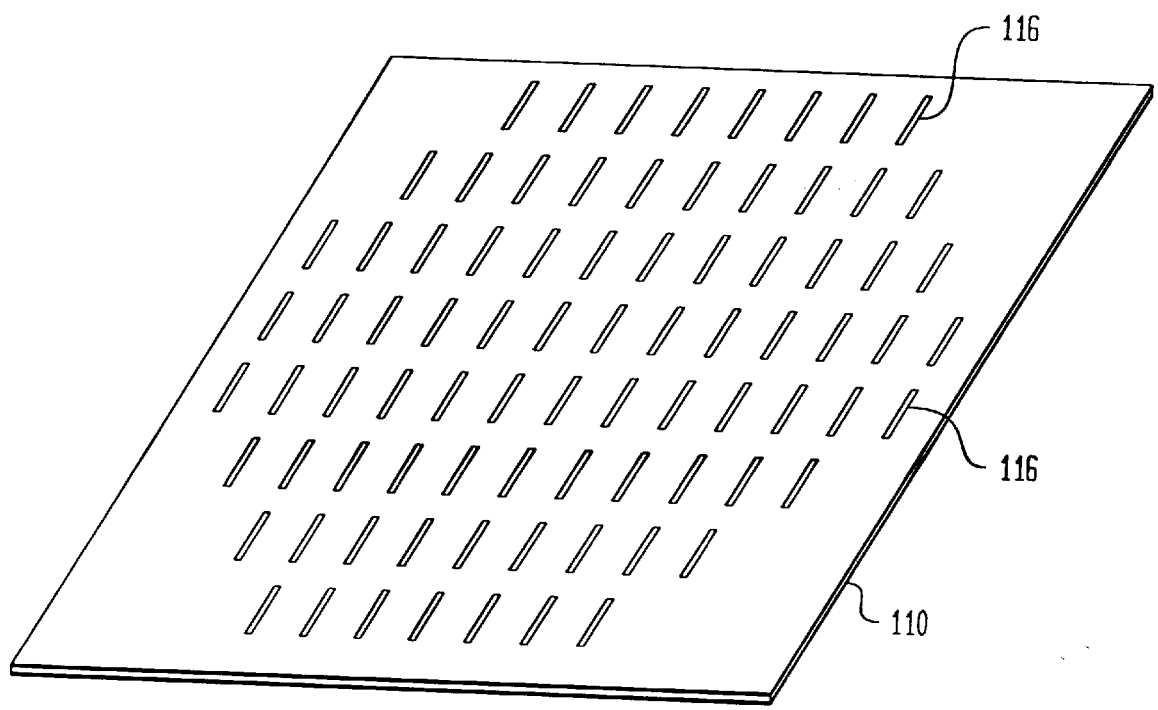
Figure 5:
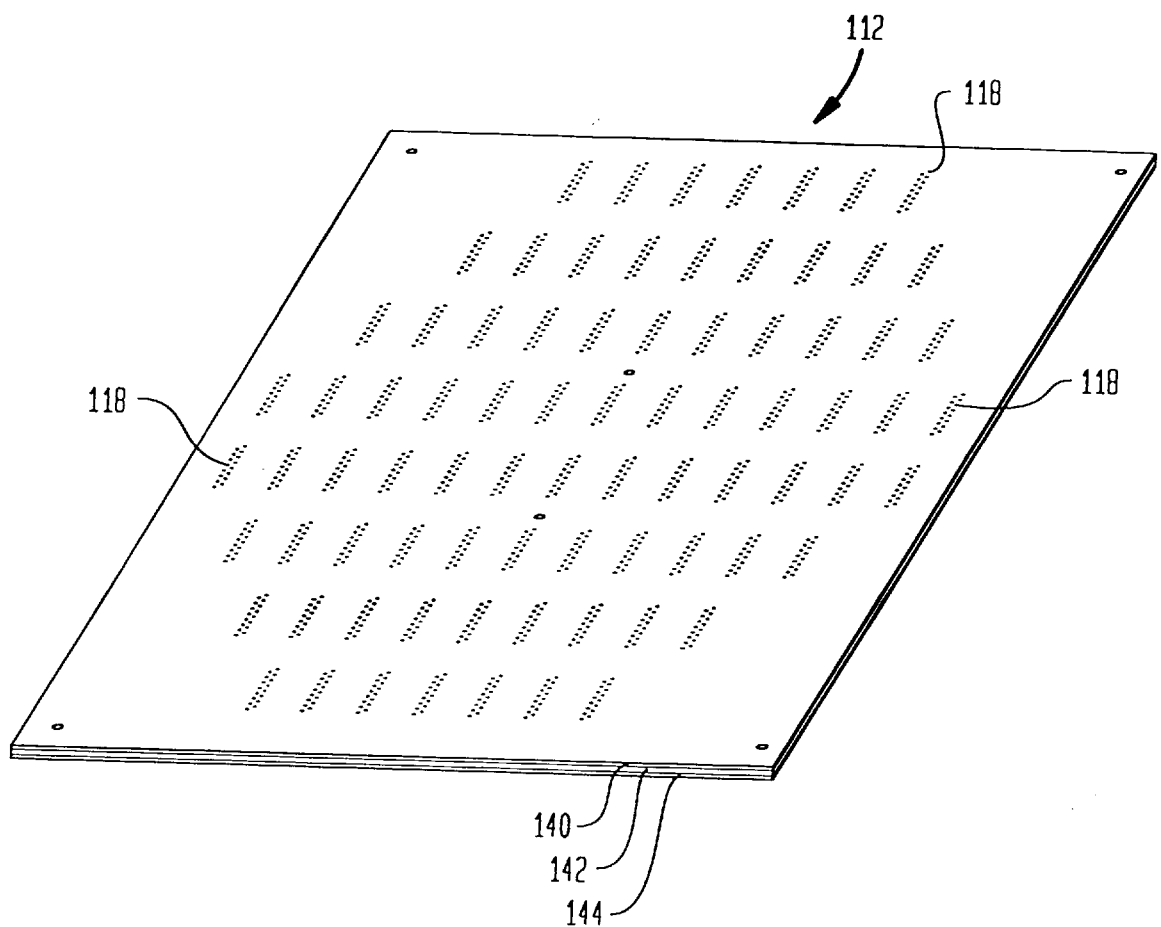
Figure 6:
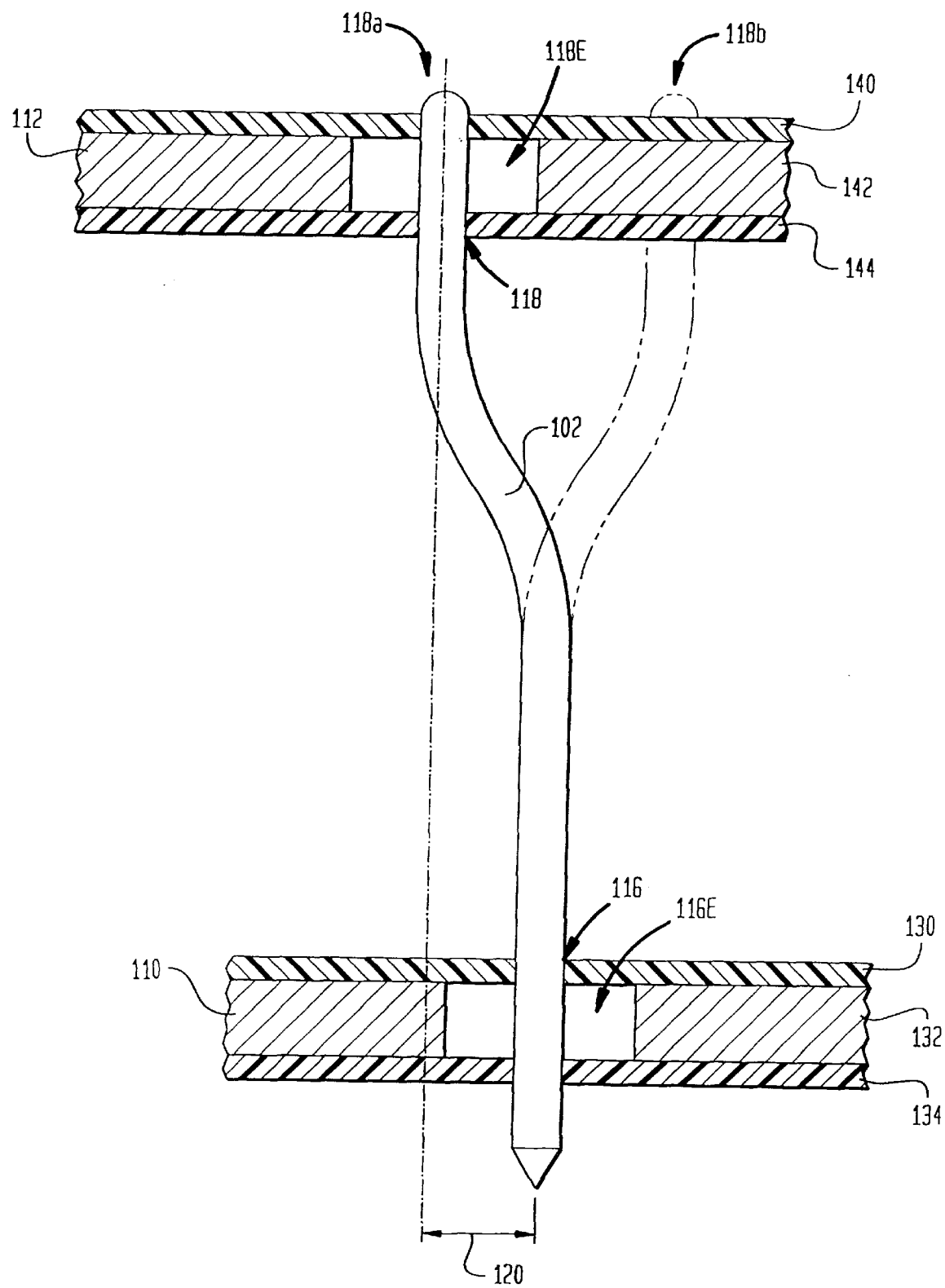
FIG. 6 illustrates an enlarged cross-sectional view of a portion of the large area multiple-chip probe assembly of FIGS. 2–5, including a single probe wire element.
Figure 7:
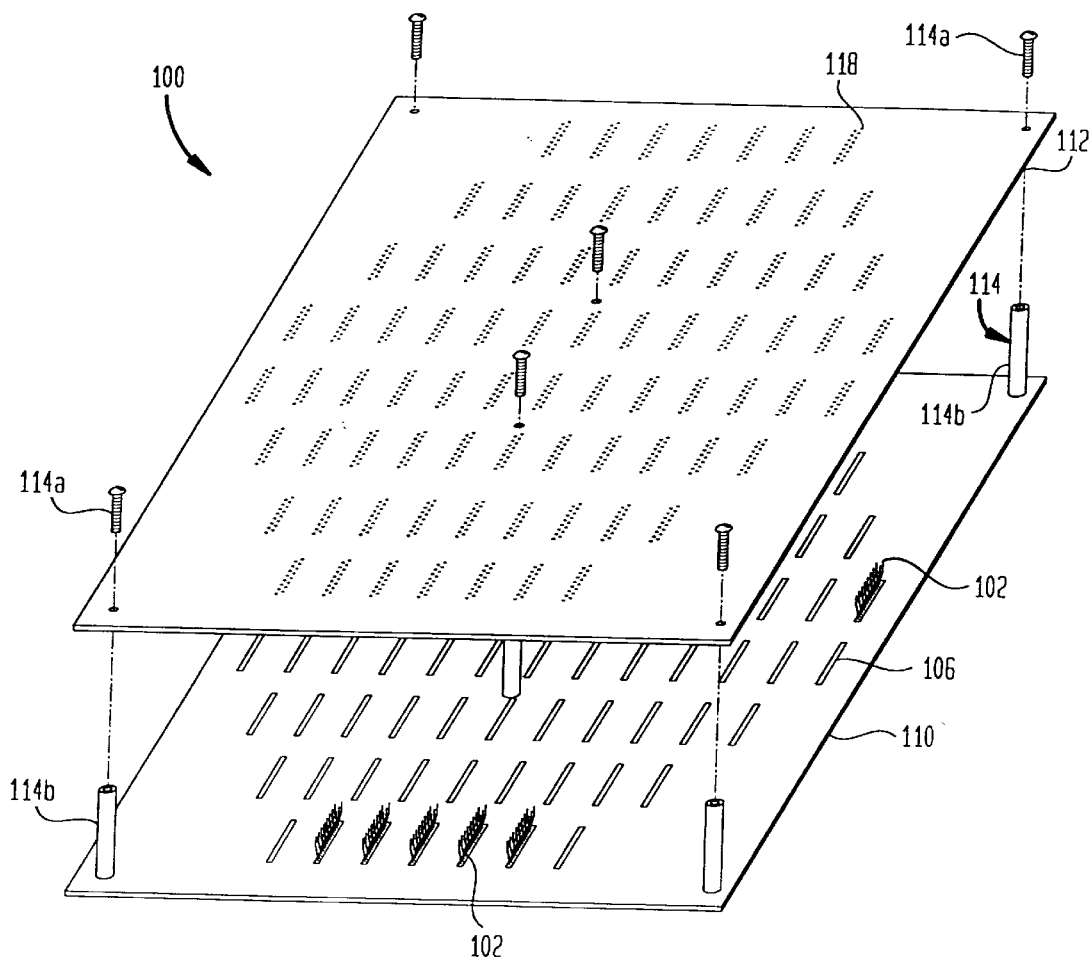
FIG. 7 illustrates an exploded view of a large area multiple-chip, probe assembly according to a second embodiment according to the present invention.

Turning now to FIGS. 2–5, in a first embodiment, the support means 104 of the multiple-chip probe assembly 100 further includes a lower layer 110, an upper layer 112, and a means 114 for spacing the upper layer 112 apart from the lower layer 110 by a desired spacing. The lower layer 110 includes individual probe element apertures 116 arranged in a prescribed manner in accordance with an electrical contact footprint of the dies or chips of a wafer 10. The electrical contact footprint of a wafer is unique to that wafer. The upper layer 112 includes individual probe element apertures 118 arranged in an offset manner by a desired amount 120 from the corresponding arrangement of probe element apertures 116 of the lower layer 110 (FIG. 6). The offset apertures 118 may further alternate from one side (118A) to the other (118B) in a varying manner as may be required. The spacing means 114 is for spacing the upper layer 112 apart from the lower layer 110 by a desired spacing amount (FIGS. 2 and 7). As shown in FIGS. 2 and 7, spacing means 114 includes a stand-off assembly having stand-offs 114b and mounting screws 114a.

Figure 3:
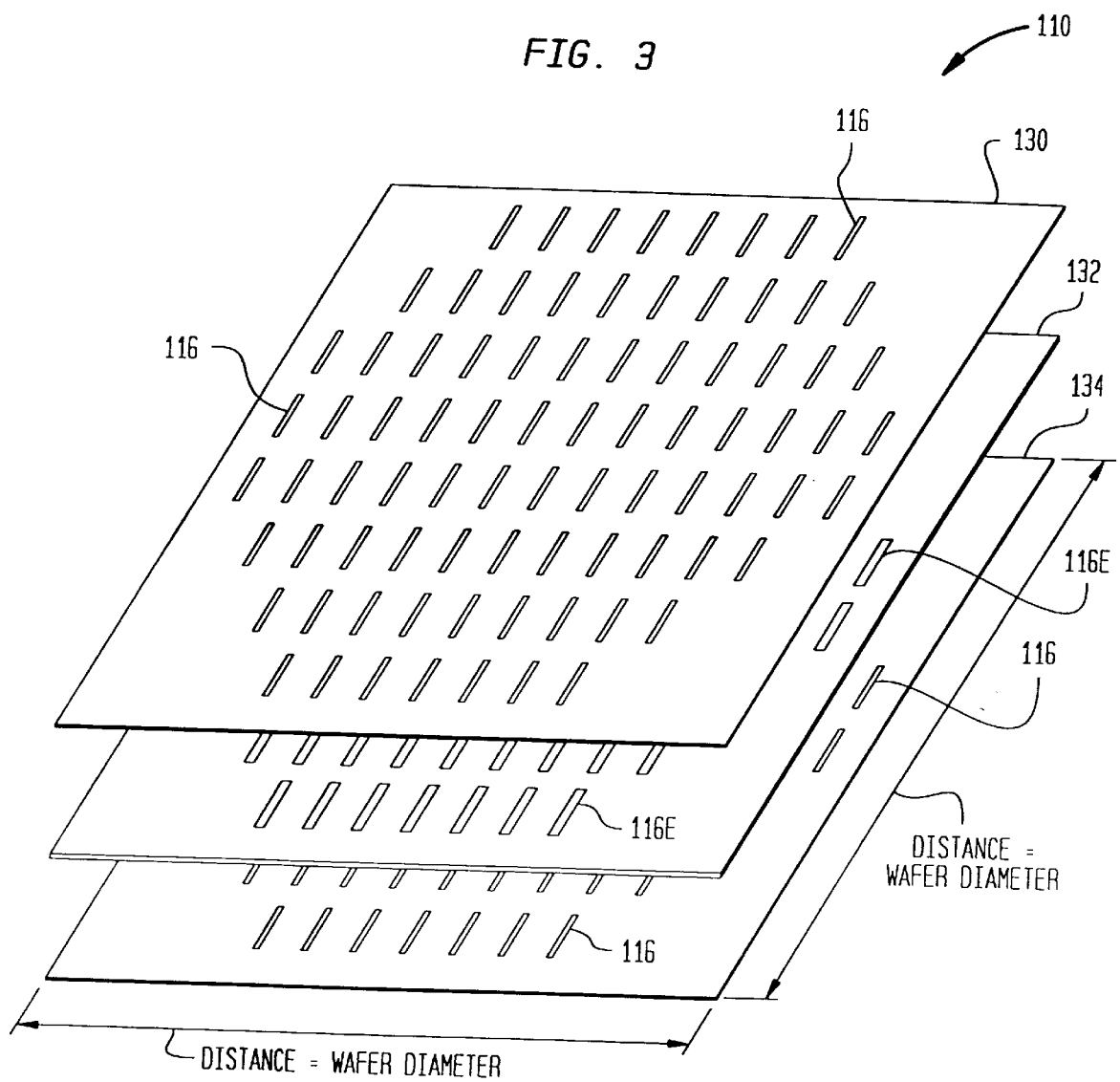

The lower layer 110 includes a laminate of a first UPILEX layer 130, an INVAR layer 132, and a second UPILEX layer 134 (see FIGS. 3, 4, 6). UPILEX is a registered trademark of Ube Industries, Ltd., of Tokyo, Japan. UPILEX is a high strength and high temperature polyimide. The first and second UPILEX layers (130, 134) each include the individual probe element apertures 116. The UPILEX layers (130, 134) have a thickness each from about 0.001 to about 0.003 inches. The INVAR layer 132 includes corresponding enlarged probe element apertures 116E. The enlarged apertures 116E are greater than the individual probe element apertures 116 for providing a desired clearance opening. As a result, an individual probe element 102 does not contact the INVAR layer 132, wherein the UPILEX provides for spacing the probe element from the INVAR. The INVAR layer 132 has a thickness from about 0.015 to about 0.030 inches. The upper layer 112 includes a similar laminate of a third UPILEX layer 140, a second INVAR layer 142, and a fourth UPILEX layer 144 (FIGS. 5, 6). The third and fourth UPILEX layers (140, 144) each include the offset individual probe element apertures 118. The UPILEX layers (140, 144) have a thickness each from about 0.001 to about 0.003 inches. In addition, the second INVAR layer 142 includes corresponding enlarged offset probe element apertures 118E. The enlarged offset apertures 118E are greater than the offset individual probe element apertures 118 for providing a desired clearance opening. As a result, an individual probe element 102 does not contact the second INVAR layer 142, wherein the UPILEX provides for spacing the probe element from the INVAR. The INVAR layer 142 has a thickness from about 0.015 to about 0.030 inches.

In an alternate embodiment referring now to FIGS. 7 and 8, the lower layer 110 includes a single layer of INVAR coated with an insulator, such as polyparaxylelene (hereinafter referred to as "parylene") 150, the INVAR support layer 152 having the individual probe element apertures 116 formed therein. The parylene 150 coats an inside of each individual probe element aperture 116 and prevents an individual probe element 102 from electrically contacting the INVAR support layer 152. In addition, with respect to the alternate embodiment of FIGS. 7 and 8, the upper layer 112 includes a second parylene 154 coated INVAR support layer 156 having the offset individual probe element apertures 118 formed therein. The second parylene 154 coats an inside of each offset individual probe element aperture 118 and prevents an individual probe element 102 from electrically contacting the second INVAR support layer 156. The INVAR support layers 152 and 156 each have a thickness from about 0.015 to about 0.030 inches. The parylene coatings, 150 and 154 each have a thickness on the order of about 0.1 to about 100 microns. The parylene coatings further provide a lubricity for the respective probe elements 102.

Figure 8:
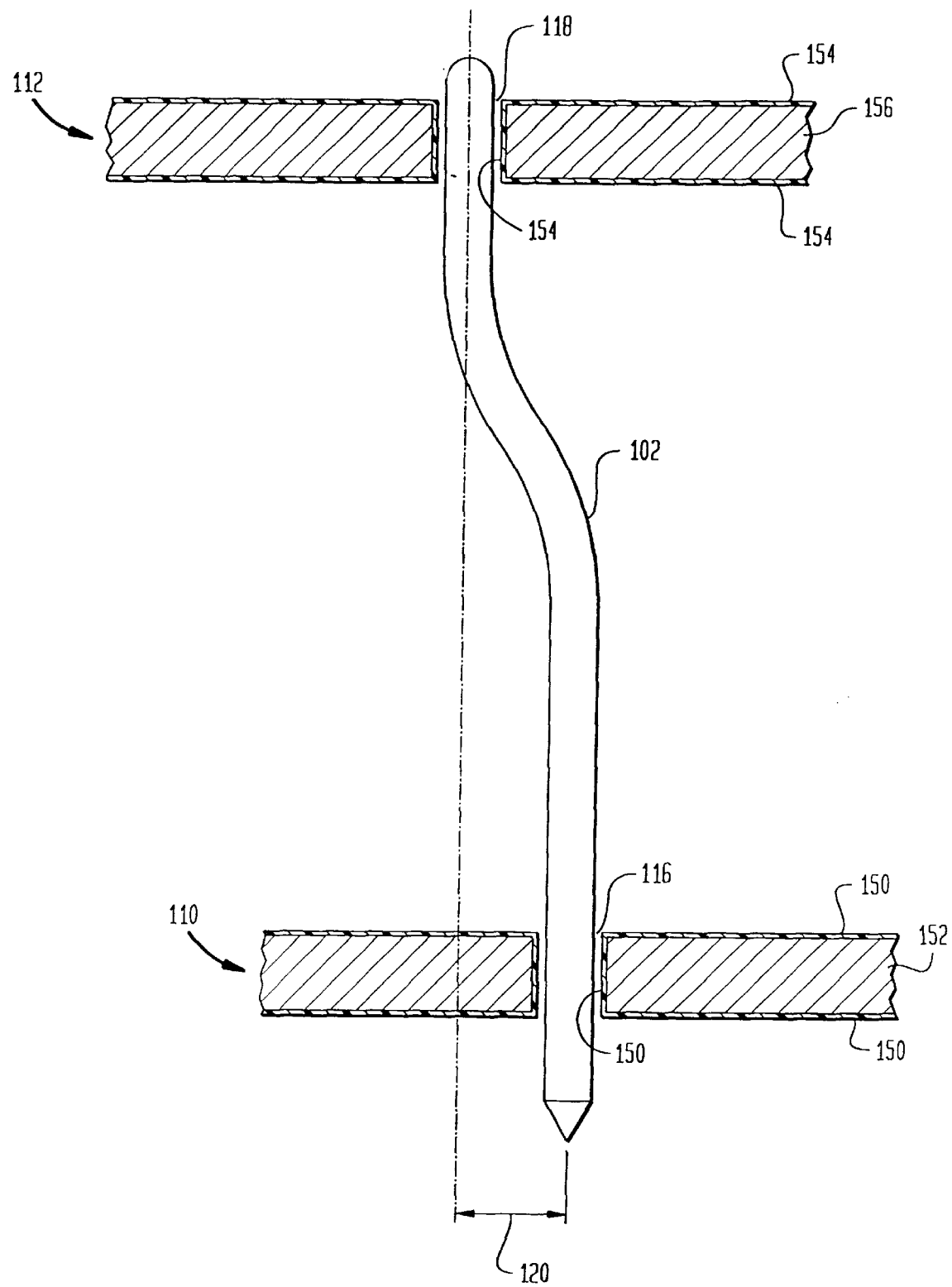
FIG. 8 illustrates an enlarged cross-sectional view of a portion of the large area multiple-chip probe assembly of FIG. 7, including a single probe wire element.
Figure 9:
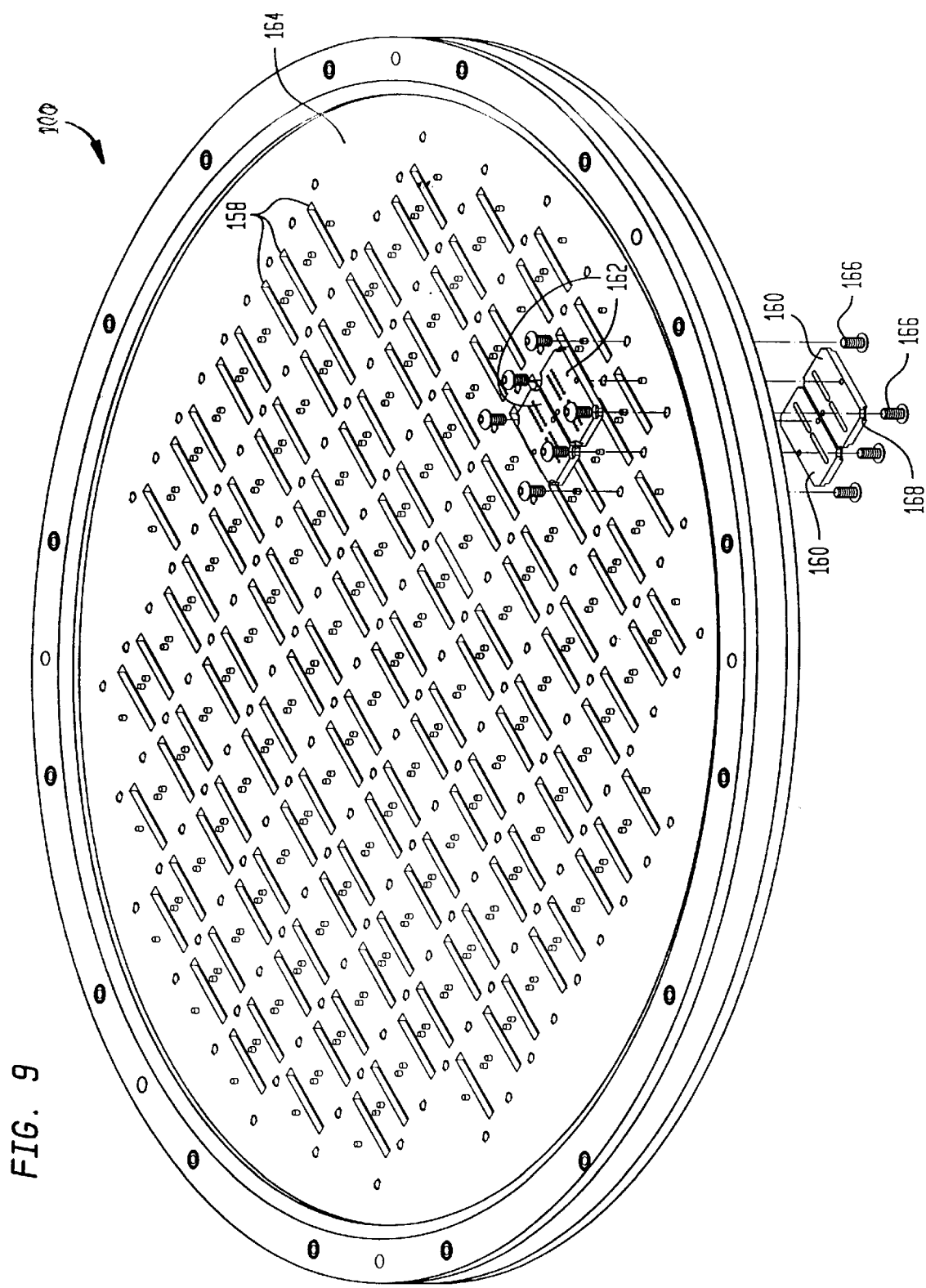
FIGS. 9 and 10 illustrate yet another embodiment of the large area multiple-chip probe assembly according to the present invention.
Figure 10:
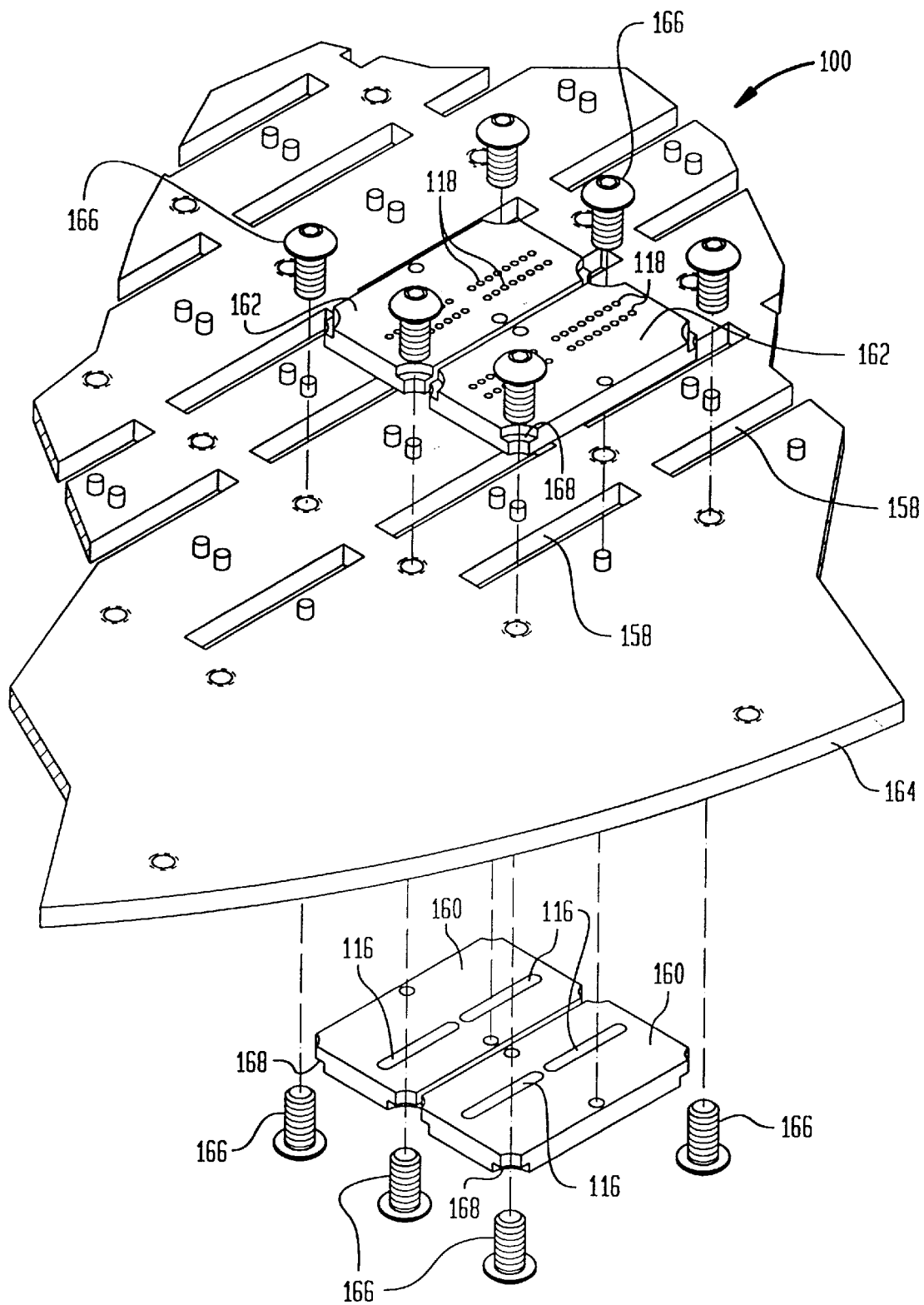

Referring now to FIGS. 9 and 10, in yet another alternate embodiment of the multiple-chip probe assembly 100 of the present invention a plurality of lower layer individual dies 160 are included, each individual die 160 having individual probe element apertures 116 therein similar to those apertures as shown with respect to apertures 116 of FIGS. 6 and 8. With respect to FIGS. 9 and 10, only two of the plurality of lower layer individual dies 160 have been shown for simplicity. It should be understood that the entire bottom surface of spacing layer 164 is populated with the lower layer individual dies 160, in an arrangement corresponding with individual chip apertures 158 of spacing layer 164. A plurality of upper layer individual dies 162 are also included, each individual die 162 having offset individual probe element apertures 118 therein similar to those apertures as shown with respect to apertures 118 of FIGS. 6 and 8. In addition, with respect to FIGS. 9 and 10, only two of the plurality of upper layer individual dies 162 have been shown for simplicity. It should further be understood that the entire top surface of spacing layer 164 is populated with the upper layer individual dies 162, in an arrangement corresponding with individual chip apertures 158 of spacing layer 164. The lower layer individual dies 160 and upper layer individual dies 162 each have a thickness from about 0.040 to about 0.080 inches, preferably 0.060 inches. Lower layer and upper layer individual dies, 160 and 162, respectively, preferably are made of UPILEX. Individual dies 160 and 162 may alternatively be made of any suitable machinable ceramic, such as MACOR, a registered trademark of Corning Glass, Corning, N.Y. Still further, individual dies 160 and 162 may be made of DELRIN or VESPEL, each trademarks of E.I. Dupont of Wilmington, Del. The particular choice of material for individual dies 160 and 162 is selected in accordance with a desired containment of localized thermal expansion for an area on the order of the size of a chip on a wafer. That is, the choice of material is dependent in part on a function of the size of the chip for limiting an amount of thermal expansion local to a single chip. The lower layer individual dies 160 and the upper layer individual dies 162 are made to a prescribed dimension to cover an area on the order of the area of an undiced chip or slightly larger. Furthermore, the spacing layer 164 is preferably made of an INVAR layer having an array of individual chip apertures 158 therein. Each of the individual chip apertures 158 is of a prescribed size larger than probe element apertures (116, 118) associated with a single chip on the wafer 10 under test. In other words, each of the individual chip apertures 158 is of a sufficient size such that the individual probe elements 102 of a group of probe elements associated with a single chip, which extend through a corresponding individual chip aperture of the multiple-chip probe assembly 100, are kept from electrically contacting the INVAR spacing layer 164. The apertures 158 are smaller in length and width dimensions than the length and width dimensions of undiced chip of the wafer, for example, on the order of the length and width dimensions of a kerf region surrounding an individual chip. The INVAR spacing layer 164 has a thickness from about 0.090 to about 0.100 inches.

Suitable fasteners 166, such as machine screws, are used for fastening the plurality of lower layer individual dies 160 and upper layer individual dies 162 to respective lower and upper surfaces of support layer 164. Not all of the fasteners 166 are shown in FIGS. 9 and 10 for simplicity. Corners of individual dies 160, 162 can be beveled or chamfered as needed, indicated by number 168 (FIGS. 9 and 10). With the embodiment as shown in FIGS. 9 and 10, an expansion of the multiple-chip probe assembly 100, due to the wide range of temperatures for a testing operation, is advantageously limited. That is, a global expansion is limited by the larger INVAR support layer 164 and a local expansion is limited to that associated with each of the individual UPILEX dies 160 of the lower layer and each of the individual UPILEX dies 162 of the upper layer. In other words, expansion effects due to various materials having different TCEs are advantageously contained to an area within a single chip on the wafer under test. An overall TCE is controlled by the larger INVAR support layer 164, thus providing a global expansion control.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit of the invention. Similarly, other changes, combinations and modifications of the presently disclosed embodiments will also become apparent. The embodiments disclosed and the details thereof are intended to teach the practice of the invention and are intended to be illustrative and not limiting. Accordingly, such apparent but undisclosed embodiments, changes, combinations, and modifications are considered to be within the spirit and scope of the present invention as limited solely by the appended claims.

What is claimed is:

1. A multiple-chip probe assembly suitable for wafer testing over a wide temperature range, said probe assembly comprising:

a plurality of individual buckling beam probe elements; and means for supporting said plurality of buckling beam probe elements in an arrangement in accordance with an electrical contact footprint for use in electrically contacting multiple chips of a wafer under test and for enabling buckling movement in a contacting direction of said plurality of buckling beams, said supporting means including a principal support material having a thermal coefficient of expansion matched with the wafer under test and a second material other than the principal support material, wherein a contact positioning of the plurality of buckling beam probe elements upon the wafer under test during a testing operation is maintained and the second material prevents an individual probe element from contacting the principal support material.

2. The multiple-chip probe assembly of claim 1, wherein the principal support material of said supporting means comprises an iron-nickel alloy.

3. The multiple-chip probe assembly of claim 2, wherein said supporting means further includes a lower layer having individual probe element apertures arranged in a prescribed manner in accordance with an electrical contact footprint for use in electrically contacting multiple chips of a wafer under test, an upper layer having individual probe element apertures arranged in an offset manner from the corresponding arrangement of probe element apertures of the lower layer, and means for spacing the upper layer apart from the lower layer by a desired spacing.

4. The multiple-chip probe assembly of claim 3, further wherein the lower layer includes a laminate of a first UPILEX layer, an iron-nickel alloy layer, and a second UPILEX layer, wherein the first and second UPILEX layers each include the individual probe element apertures and wherein the iron-nickel alloy layer includes corresponding enlarged probe element apertures, the enlarged apertures having a size dimension greater than the individual probe element apertures, wherein an individual probe element does not contact the iron-nickel alloy layer, and the upper layer includes a laminate of a third UPILEX layer, a second iron-nickel alloy layer, and a fourth UPILEX layer, wherein the third and fourth UPILEX layers each include the offset individual probe element apertures and wherein the second iron-nickel alloy layer includes corresponding enlarged offset probe element apertures, the enlarged offset apertures having a size dimension greater than the offset individual probe element apertures, wherein an individual probe element does not contact the second iron-nickel alloy layer.

5. The multiple-chip probe assembly of claim 3, further wherein the lower layer includes a parylene coated iron-nickel alloy support layer having the individual probe element apertures formed therein, wherein parylene coats an inside of each individual probe element aperture and prevents an individual probe element from contacting the iron-nickel alloy support layer, and the upper layer includes a second parylene coated iron-nickel alloy support layer having the offset individual probe element apertures formed therein, wherein the second parylene coats an inside of each offset individual probe element aperture and prevents an individual probe element from contacting the second iron-nickel alloy support layer.

6. The multiple-chip probe assembly of claim 3, further wherein the lower layer includes a plurality of individual dies, each individual die having the individual probe element apertures therein, the upper layer includes a plurality of individual dies, each individual die having the offset individual probe element apertures therein, and the spacing means includes an iron-nickel alloy layer having an array of individual chip apertures therein, an individual chip aperture having a dimension larger than a group of probe element apertures associated with a single chip on the wafer under test to prevent individual probe elements from electrically contacting the iron-nickel alloy layer.

7. The multiple-chip probe assembly of claim 1, wherein said supporting means further includes a lower layer, an upper layer, and means for spacing said upper layer apart from the lower layer by a desired spacing.

8. The multiple-chip probe assembly of claim 7, further wherein the lower layer includes a plurality of individual dies, the upper layer includes a plurality of individual dies, and the spacing means includes an iron-nickel alloy layer.

9. The multiple chip probe assembly of claim 7, wherein said lower layer, said upper layer and said means for spacing said upper layer apart from the lower layer are integral with said supporting means.

10. The multiple chip probe assembly of claim 7, wherein said lower layer, said upper layer and said means for spacing said upper layer apart from the lower layer are attached to said supporting means.

11. The multiple-chip probe assembly of claim 7, further wherein the lower layer includes a laminate, and the upper includes a laminate.

12. The multiple-chip probe assembly of claim 11, further wherein the lower layer laminate includes a UPILEX, iron-nickel alloy, UPILEX laminate, and the upper layer laminate includes a UPILEX, iron-nickel alloy, UPILEX laminate.

13. The multiple-chip probe assembly of claim 11, further wherein the lower layer laminate includes a parylene coated iron-nickel alloy support layer, and the upper layer laminate includes a parylene coated iron-nickel alloy support layer.

14. The multiple-chip probe assembly of claim 1, wherein said supporting means further includes a lower layer having individual probe element apertures arranged in a prescribed manner in accordance with an electrical contact footprint for use in electrically contacting multiple chips of a wafer under test, an upper layer having individual probe element apertures arranged in an offset manner from the corresponding arrangement of probe element apertures of the lower layer, and means for spacing the upper layer apart from the lower layer by a desired spacing.

15. The multiple-chip probe assembly of claim 14, further wherein the lower layer includes a laminate, and the upper layer includes a laminate.

16. The multiple-chip probe assembly of claim 15, further wherein the lower layer laminate includes a first UPILEX layer, an iron-nickel alloy layer, and a second UPILEX layer, wherein the first and second UPILEX layers each include respective individual probe element apertures and wherein the iron-nickel alloy layer includes corresponding enlarged probe element apertures, the enlarged apertures having a size dimension greater than the individual probe element apertures, wherein an individual probe element does not electrically contact the iron-nickel alloy layer, and the upper layer laminate includes a third UPILEX layer, a second iron-nickel alloy layer, and a fourth UPILEX layer, wherein the third and fourth UPILEX layers each include respective offset individual probe element apertures and wherein the second iron-nickel alloy layer includes corresponding enlarged offset probe element apertures, the enlarged offset apertures having a size dimension greater than the offset individual probe element apertures, wherein an individual probe element does not electrically contact the second iron-nickel alloy layer.

17. The multiple-chip probe assembly of claim 14, further wherein the lower layer includes a parylene coated iron-nickel alloy support layer having respective individual probe element apertures formed therein, wherein parylene coats an inside of each individual probe element aperture and prevents an individual probe element from electrically contacting the iron-nickel alloy support layer, and the upper layer includes a second parylene coated iron-nickel alloy support layer having respective offset individual probe element apertures formed therein, wherein the second parylene coats an inside of each offset individual probe element aperture and prevents an individual probe element from electrically contacting the second iron-nickel alloy support layer.

18. The multiple-chip probe assembly of claim 14, further wherein the lower layer includes a plurality of individual dies, wherein each individual die includes respective individual probe element apertures, the upper layer includes a plurality of individual dies, wherein each individual die includes respective offset individual probe element apertures, and the spacing means includes an iron-nickel alloy layer, wherein the iron-nickel alloy layer includes an array of individual chip apertures, an individual chip aperture having a dimension larger than a group of probe element apertures associated with a single chip on the wafer under test to prevent respective individual probe elements from electrically contacting the iron-nickel alloy layer.

19. A test apparatus for testing a wafer over a wide temperature range including a multiple-chip probe assembly, said probe assembly comprising:

a plurality of individual buckling beam probe elements; and means for supporting said plurality of buckling beam probe elements in an arrangement in accordance with an electrical contact footprint for use in electrically contacting multiple chips of a wafer under test and for enabling buckling movement in a contacting direction of said plurality of buckling beams, said supporting means including a principal support material of iron-nickel alloy and a second material other than the principal support material, wherein a contact positioning of the plurality of buckling beam probe elements upon the wafer under test during a testing operation is maintained and the second material prevents an individual probe element from electrically contacting the principal support material.

20. The test apparatus of claim 19, wherein said supporting means further includes a lower layer having individual probe element apertures arranged in a prescribed manner in accordance with an electrical contact footprint for use in electrically contacting multiple chips of a wafer under test, an upper layer having individual probe element apertures arranged in an offset manner from the corresponding arrangement of probe element apertures of the lower layer, and means for spacing the upper layer apart from the lower layer by a desired spacing.

21. The test apparatus of claim 20, further wherein the lower layer includes a laminate of a first UPILEX layer, an iron-nickel alloy layer, and a second UPILEX layer, wherein the first and second UPILEX layers each include the individual probe element apertures and wherein the iron-nickel alloy layer includes corresponding enlarged probe element apertures, the enlarged apertures having a size dimension greater than the individual probe element apertures, wherein an individual probe element does not electrically contact the iron-nickel alloy layer, and the upper layer includes a laminate of a third UPILEX layer, a second iron-nickel alloy layer, and a fourth UPILEX layer, wherein the third and fourth UPILEX layers each include respective offset individual probe element apertures and wherein the second iron-nickel alloy layer includes corresponding enlarged offset probe element apertures, the enlarged offset apertures having a size dimension greater than the offset individual probe element apertures, wherein an individual probe element does not electrically contact the second iron-nickel alloy layer.

22. The test apparatus of claim 20, further wherein the lower layer includes a parylene coated iron-nickel alloy support layer having the individual probe element apertures formed therein, wherein parylene coats an inside of each individual probe element aperture and prevents an individual probe element from electrically contacting the iron-nickel alloy support layer, and the upper layer includes a second parylene coated iron-nickel alloy support layer having the offset individual probe element apertures formed therein, wherein the second parylene coats an inside of each offset individual probe element aperture and prevents an individual probe element from electrically contacting the second iron-nickel alloy support layer.

23. The test apparatus of claim 20, further wherein the lower layer includes a plurality of individual dies, each individual die having the individual probe element apertures therein, the upper layer includes a plurality of individual dies, each individual die having the offset individual probe element apertures therein, and the spacing means includes an INVAR layer having an array of individual chip apertures therein, an individual chip aperture having a dimension larger than a group of probe element apertures associated with a single chip on the wafer under test to prevent individual probe elements from electrically contacting the iron-nickel alloy layer.

24. The multiple chip probe assembly of claim 20, wherein said lower layer, said upper layer and said means for spacing said upper layer apart from the lower layer are integral with said supporting means.

25. The multiple chip probe assembly of claim 20, wherein said lower layer, said upper layer and said means for spacing said upper layer apart from the lower layer are attached to said supporting means.

26. A method of forming a multiple-chip probe assembly suitable for wafer testing over a wide temperature range, said method comprising the steps of:

providing a plurality of individual buckling beam probe elements; and supporting the plurality of buckling beam probe elements in an arrangement in accordance with an electrical contact footprint for use in electrically contacting multiple chips of a wafer under test and enabling buckling movement in a contacting direction of the plurality of buckling beams, said supporting step including providing a principal support material and a second material other than the principal support material, wherein a contact positioning of the plurality of buckling beam probe elements upon the wafer under test during a testing operation is maintained and the second material prevents an individual probe element from electrically contacting the principal support material.

27. The method of claim 26, wherein the principal support material includes an iron-nickel alloy.

28. The method of claim 27, wherein said supporting step further includes providing a lower layer having individual probe element apertures arranged in a prescribed manner in accordance with an electrical contact footprint for use in electrically contacting multiple chips of a wafer under test, providing an upper layer having individual probe element apertures arranged in an offset manner from the corresponding arrangement of probe element apertures of the lower layer, and spacing the upper layer apart from the lower layer by a desired spacing.

29. The method of claim 28, further wherein the lower layer includes a laminate of a first UPILEX layer, an iron-nickel alloy layer, and a second UPILEX layer, wherein the first and second UPILEX layers each include the individual probe element apertures and wherein the iron-nickel alloy layer includes corresponding enlarged probe element apertures, the enlarged apertures having a size dimension greater than the individual probe element apertures, wherein an individual probe element does not electrically contact the iron-nickel alloy layer, and the upper layer includes a laminate of a third UPILEX layer, a second iron-nickel alloy layer, and a fourth UPILEX layer, wherein the third and fourth UPILEX layers each include respective offset individual probe element apertures and wherein the second iron-nickel alloy layer includes corresponding enlarged offset probe element apertures, the enlarged offset apertures having a size dimension greater than the offset individual probe element apertures, wherein an individual probe element does not electrically contact the second iron-nickel alloy layer.

30. The method of claim 28, further wherein the lower layer includes a parylene coated iron-nickel alloy support layer having the individual probe element apertures formed therein, wherein parylene coats an inside of each individual probe element aperture and prevents an individual probe element from electrically contacting the iron-nickel alloy support layer, and the upper layer includes a second parylene coated iron-nickel alloy support layer having the offset individual probe element apertures formed therein, wherein the second parylene coats an inside of each offset individual probe element aperture and prevents an individual probe element from electrically contacting the second iron-nickel alloy support layer.

31. The method of claim 28, further wherein the lower layer includes a plurality of individual dies, each individual die having the individual probe element apertures therein, the upper layer includes a plurality of individual dies, each individual die having the offset individual probe element apertures therein, and spacing includes using an iron-nickel alloy layer having an array of individual chip apertures therein, an individual chip aperture having a dimension larger than a group of probe element apertures associated with a single chip on the wafer under test to prevent individual probe elements from electronically contacting the iron-nickel alloy layer.

* * * * *